United States Patent
El Gawhary et al.

(10) Patent No.: US 9,175,951 B2
(45) Date of Patent: Nov. 3, 2015

(54) METHOD AND APPARATUS FOR DETERMINING STRUCTURE PARAMETERS OF MICROSTRUCTURES

(75) Inventors: Omar El Gawhary, Delft (NL); Stefan Jacobus Hendrikus Petra, Veldhoven (NL)

(73) Assignees: ASML Netherlands B.V., Veldhoven (NL); Technische Universiteit Delft, Delft (NL)

( * ) Notice: Subject to any disclaimer, the term of this patent is extended or adjusted under 35 U.S.C. 154(b) by 709 days.

(21) Appl. No.: 13/413,940

(22) Filed: Mar. 7, 2012

(65) Prior Publication Data

US 2012/0243004 A1 Sep. 27, 2012

Related U.S. Application Data

(60) Provisional application No. 61/454,674, filed on Mar. 21, 2011.

(51) Int. Cl.
    *G01B 9/02*     (2006.01)
    *G01B 11/24*     (2006.01)
    *G03F 7/20*     (2006.01)

(52) U.S. Cl.
    CPC .............. *G01B 11/24* (2013.01); *G03F 7/705* (2013.01); *G03F 7/70625* (2013.01); *G01B 2210/56* (2013.01)

(58) Field of Classification Search
    CPC   G01B 11/24; G01B 2210/56; G03F 7/70625; G03F 7/705
    USPC ....................................................... 356/521
    See application file for complete search history.

(56) References Cited

U.S. PATENT DOCUMENTS

| | | | | |
|---|---|---|---|---|
| 5,963,329 A | * | 10/1999 | Conrad et al. | 356/613 |
| 7,061,623 B2 | * | 6/2006 | Davidson | 356/497 |
| 7,830,524 B2 | * | 11/2010 | Teramura et al. | 356/477 |
| 2002/0027661 A1 | * | 3/2002 | Arieli et al. | 356/512 |
| 2005/0123844 A1 | | 6/2005 | Monshouwer | |
| 2008/0088854 A1 | | 4/2008 | Marie Kiers et al. | |
| 2008/0117434 A1 | | 5/2008 | Verstappen et al. | |

(Continued)

OTHER PUBLICATIONS

International Search Report and the Written Opinion of the International Searching Authority directed to related International Patent Application No. PCT/EP2012/053773, mailed May 7, 2012, from the European Patent Office; 10 pages.

(Continued)

*Primary Examiner* — Tarifur Chowdhury
*Assistant Examiner* — Jonathon Cook
(74) *Attorney, Agent, or Firm* — Sterne, Kessler, Goldstein & Fox P.L.L.C.

(57) ABSTRACT

A method of determining a structure parameter of a target. Illuminating a first region of the target with a first beam and measuring a diffraction pattern. Shifting the position between the target and the projection system to offset a second region to be illuminated from the first region. Illuminating the second region and measuring a diffraction pattern. Retrieving phase information from the measured first and second diffraction patterns. Modeling the target using an estimated structure parameter to calculate a modeled diffraction pattern and modeled phase information. Determining the structure parameter of the target by comparing the measured diffraction patterns and the retrieved phase to the calculated modeled diffraction intensity pattern and the modeled phase information.

19 Claims, 10 Drawing Sheets

(56) References Cited

U.S. PATENT DOCUMENTS

2009/0094005 A1     4/2009   Den Boef et al.
2010/0007881 A1     1/2010   Shyu et al.
2011/0013188 A1     1/2011   Slotboom et al.

OTHER PUBLICATIONS

Barouch, E., et al., "Scatterometry as a Practical in situ Metrology Technology,"Proceedings of the SPIE, Metrology, Inspection, and Process Control for Microlithography XVII, vol. 5038, 2003; pp. 559-567.

Bodermann, B., et al., "Numerical investigations of prospects, challenges and limitations of non-imaging optical metrology of structured surfaces," Proceedings of SPIE: Modeling Aspects in Optical Metrology II, vol. 7390, 2009; pp. 43900R-1 to 73900R-9.

Born, M., et al., "Principles of Optics," Seventh Edition, Cambridge University Press, 2001; pp. 217-227.

Colton, D., et al., "Inverse Acoustic and Electromagnetic Scattering Theory," 2nd Edition, Springer, 1998; pp. 85-93.

Faulkner, H.M.L., et al., "Error tolerance of an iterative phase retrieval algorithm for moveable illumination microscopy," Ultramicroscopy, vol. 103, 2005; pp. 153-164.

Gereige, I., et al., "Recognition of diffraction-grating profile using a neural network classifier in optical scatterometry," Journal of the Optical Society of America A, vol. 25, No. 7, Jul. 2008; pp. 1661-1667.

Ko, C.-H., et al., "Overlay measurement using angular scatterometer for the capability of integrated metrology," Optics Express, vol. 14, No. 13, Jun. 26, 2006; pp. 6001-6010.

Li, L., "Use of Fourier series in the analysis of discontinuous periodic structures," Journal of the Optical Society of America A, vol. 13, No. 9, Sep. 1996a; pp. 1870-1876.

Moharam, M.G., et al., "Formulation for stable and efficient implementation of the rigorous coupled-wave analysis of binary gratings," Journal of the Optical Society of America A, vol. 12, No. 5, May 1995; pp. 1068-1076.

Moharam, M.G., et al., "Rigorous coupled-wave analysis of planar-grating diffraction," Journal of the Optical Society of America, vol. 71, No. 7, Jul. 1981; pp. 811-818.

"Optical grating scatterometry," American National Institute Technology, accessed at http://www.nist.gov/physlab/div844/grp06/scatterometry.cfm, last updated Oct. 18, 2010; 1 page.

Papoulis, A., "Chapter 9: Statistics," Probability, random variables, and stochastic processes, McGraw-Hill International Editions, 1991; pp. 241-282.

Press, W.H., et al., "Numerical Recipes in C: The Art of Scientific Computing," Second Edition, Cambridge University Press, 1995; pp. 657-674.

Rayleigh, L., "On the Dynamical Theory of Gratings," Proceedings of the Royal Society of London Series A, Containing Papers of a Mathematical and Physical Character, vol. 79, No. 532, Aug. 2, 1907; pp. 399-416.

Rodenburg, J.M., et al., "Hard-X-Ray Lensless Imaging of Extended Objects," Physical Review Letters, vol. 98, Jan. 2007; pp. 034801-1 to 034801-4.

Rodenburg, J.M., et al., "Transmission microscopy without lenses for objects of unlimited size," Ultramicroscopy, vol. 107, 2006; pp. 1-5.

Silver, R., et al., "Fundamental limits of optical critical dimension metrology: a simulation study," Proceedings of the SPIE, Metrology, Inspection, and Process Control for Microlithography XXI, vol. 6518, 2007; pp. 65180U-1 to 65180U-17.

"The International Technology Roadmap for Semiconductors: Metrology," 2009 Edition; 39 pages.

Tishchenko, A.V., "Numerical demonstration of the validity of the Rayleigh hypothesis," Optics Express, vol. 17, No. 19, Sep. 14, 2009; pp. 17102-17117.

\* cited by examiner

METHOD AND APPARATUS FOR DETERMINING STRUCTURE PARAMETERS OF MICROSTRUCTURES

CROSS REFERENCE TO RELATED APPLICATIONS

This application claims the benefit under 35 U.S.C. §119(e) to U.S. Provisional Patent Application No. 61/454,674, filed Mar. 21, 2011, which is incorporated by reference herein in its entirety.

BACKGROUND

1. Field of the Invention

The present invention relates to methods and apparatus for determining structure parameters, such as critical dimension and side wall angle, of microstructures. The present invention is usable, for example, in the manufacture of devices by lithographic techniques.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

With reduction of the physical dimensions in lithographic processing, the current scatterometer measurement techniques cannot provide the required performance in terms of accuracy and other solutions are required. In other words, the scatterometer measurement techniques, as implemented so far, are not sensitive enough to "see" small variations in the target's shape. If such measurements do not see such small variations, they cannot measure them with the required accuracy. Once the detector, the wavelength of the light source, and the optical system are chosen, this is a limitation which is difficult to overcome.

BRIEF SUMMARY

Therefore, it is desirable to improve the measurement accuracy of parameters of the patterned substrate when using a scatterometer.

According to a first aspect of the present invention, there is provided a method of determining a structure parameter of a target on a substrate, the method comprising the steps illuminating a first region of the target with a first beam of coherent radiation using a projection system, measuring a diffraction intensity pattern arising from the illumination of the first region, illuminating a second region of the target, offset from and overlapping with the first region, with a second beam of coherent radiation using the projection system, measuring a second diffraction intensity pattern arising from the illumination of the second region, retrieving phase information from the measured first and second diffraction intensity patterns, modeling the target using an estimated structure parameter to calculate a modeled diffraction intensity pattern and modeled phase information, determining the structure parameter of the target corresponding to the estimated structure parameter by comparing: at least one of the first and second measured diffraction intensity patterns and the retrieved phase to the calculated modeled diffraction intensity pattern and the modeled phase information.

According to a second aspect of the present invention, there is provided an inspection apparatus for determining a structure parameter of a target on a substrate, the apparatus comprising: a projection system configured to illuminate a first region of the target with a first beam of coherent radiation, a measurement system configured to measure a diffraction intensity pattern arising from the illumination of the first region, wherein the projection system is configured to illuminate a second region of the target, offset from and overlapping with the first region, with a second beam of coherent radiation and the measurement system is configured to measure a second diffraction intensity pattern arising from the illumination of the second region, and a processor configured to retrieve phase information from the measured first and second diffraction intensity patterns, model the target using an estimated structure parameter to calculate a modeled diffraction intensity pattern and modeled phase information, determine the structure parameter of the target corresponding to the estimated structure parameter by comparing at least one of the first and second measured diffraction intensity patterns and the retrieved phase to the calculated modeled diffraction intensity pattern and the modeled phase information.

According to a third aspect of the present invention, there is provided a computer program product containing one or more sequences of machine-readable instructions for determining a structure parameter of a target on a substrate, the instructions being adapted to cause one or more processors to perform a method comprising illuminating a first region of the target with a first beam of coherent radiation using a projection system, measuring a diffraction intensity pattern arising from the illumination of the first region, illuminating a second region of the target, offset from and overlapping with the first region, with a second beam of coherent radiation using the projection system, measuring a second diffraction intensity pattern arising from the illumination of the second region, retrieving phase information from the measured first and second diffraction intensity patterns, modeling the target using an estimated structure parameter to calculate a modeled diffraction intensity pattern and modeled phase information, determining the structure parameter of the target corresponding to the estimated structure parameter by comparing at least one of the first and second measured diffraction intensity patterns and the retrieved phase to the calculated modeled diffraction intensity pattern and the modeled phase information.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 11A:
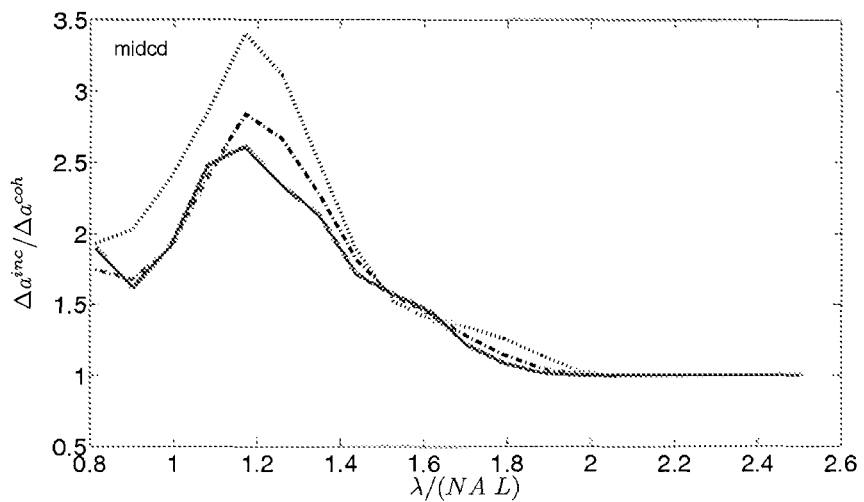
Figure 11B:
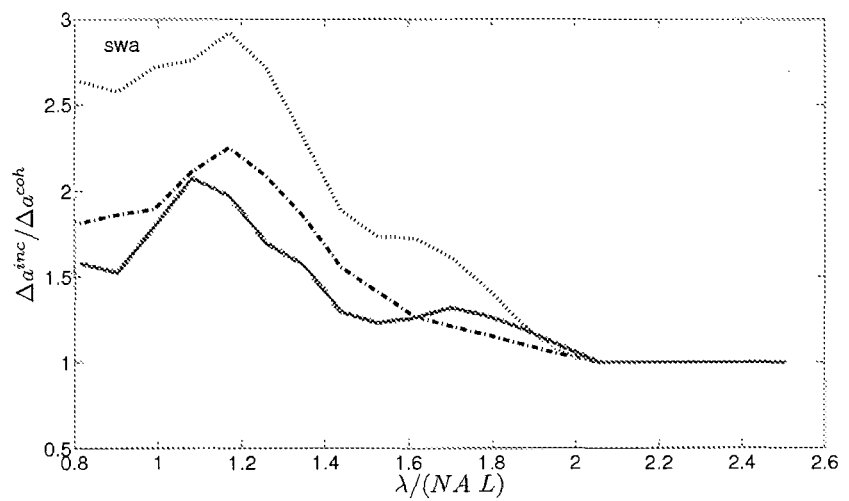
Figure 11C:
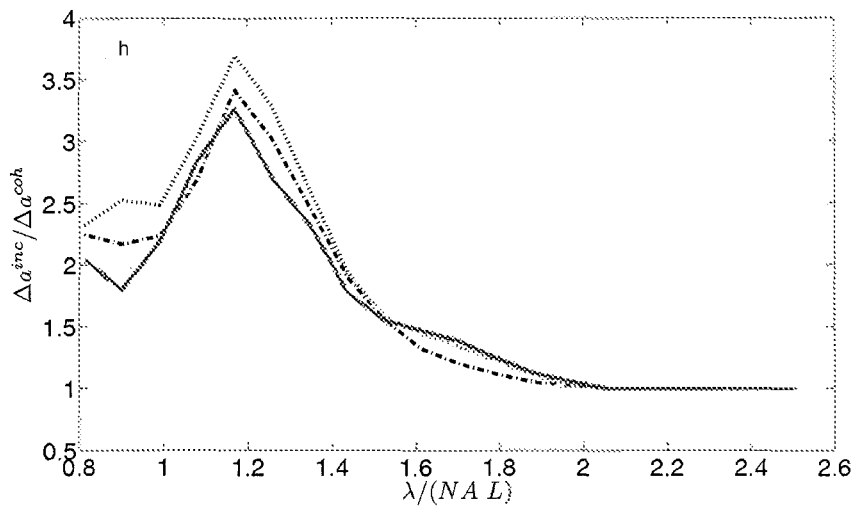

FIG. 11a-c show the calculated ratio between the structure parameter uncertainties $\Delta a^{inc}$ and $\Delta a^{coh}$, for incoherent and coherent light respectively.

Figure 12:
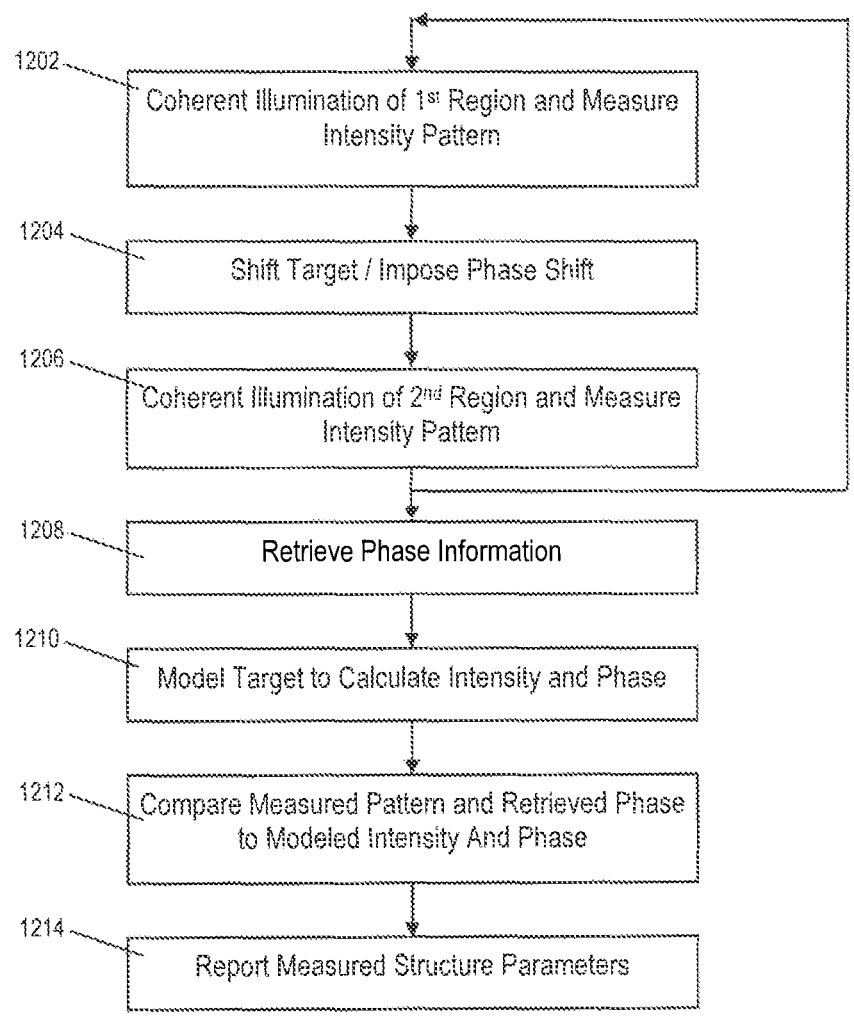

FIG. 12 is a flow chart of a method according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
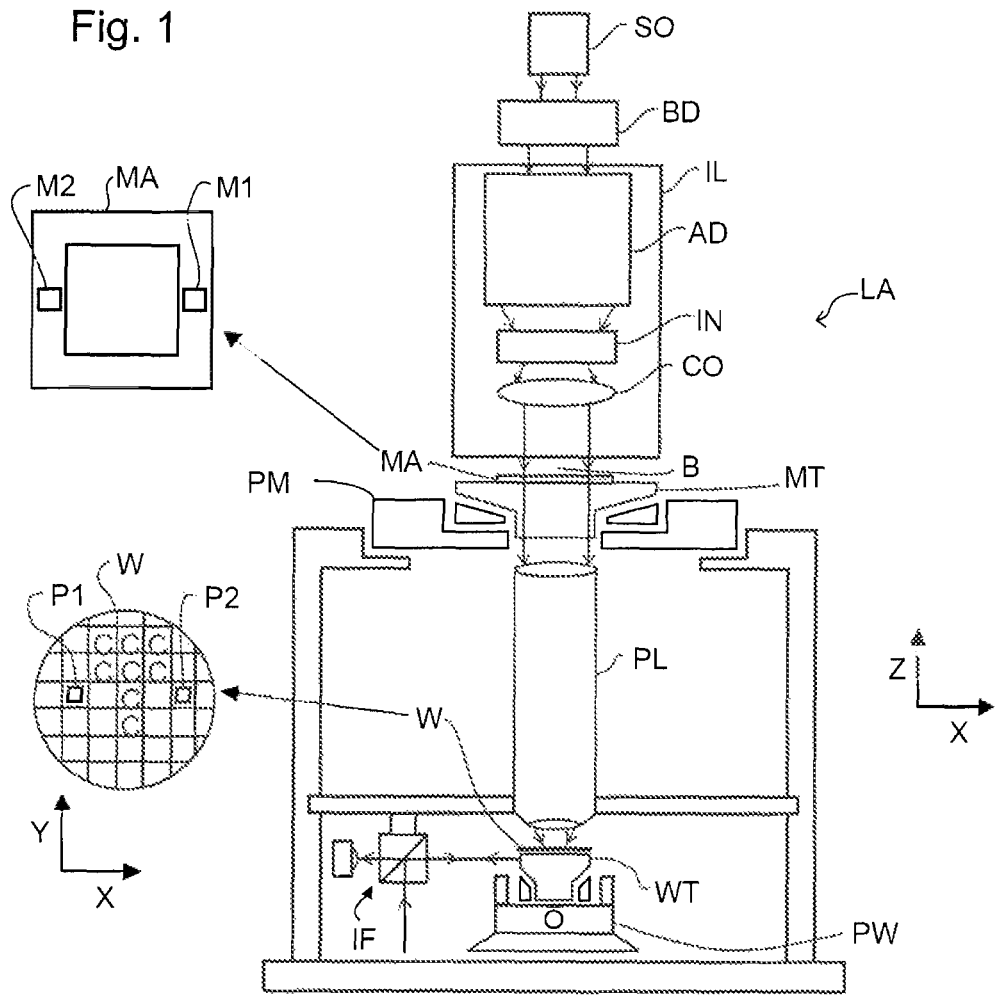
FIG. 1 depicts a lithographic apparatus.

FIG. 1 schematically depicts a lithographic apparatus. The apparatus comprises an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
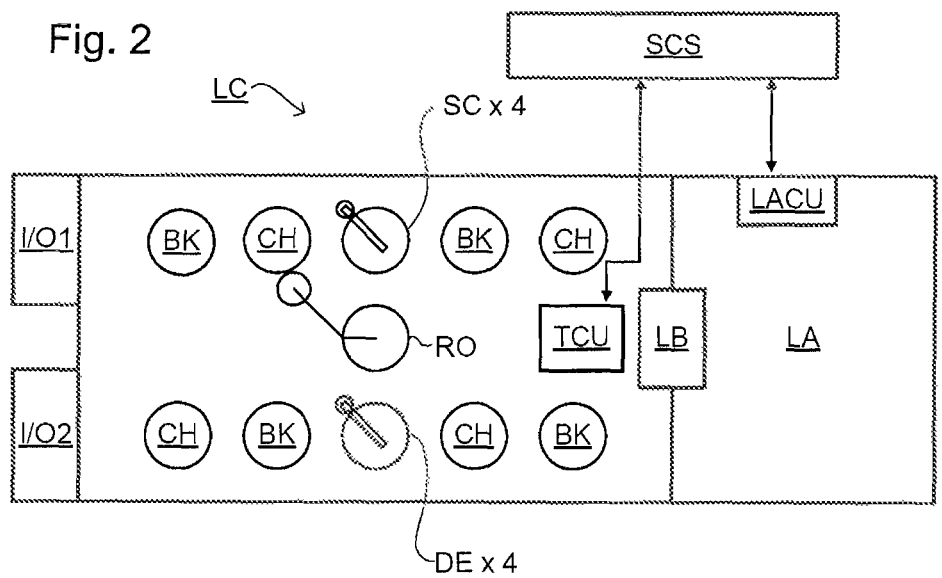
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
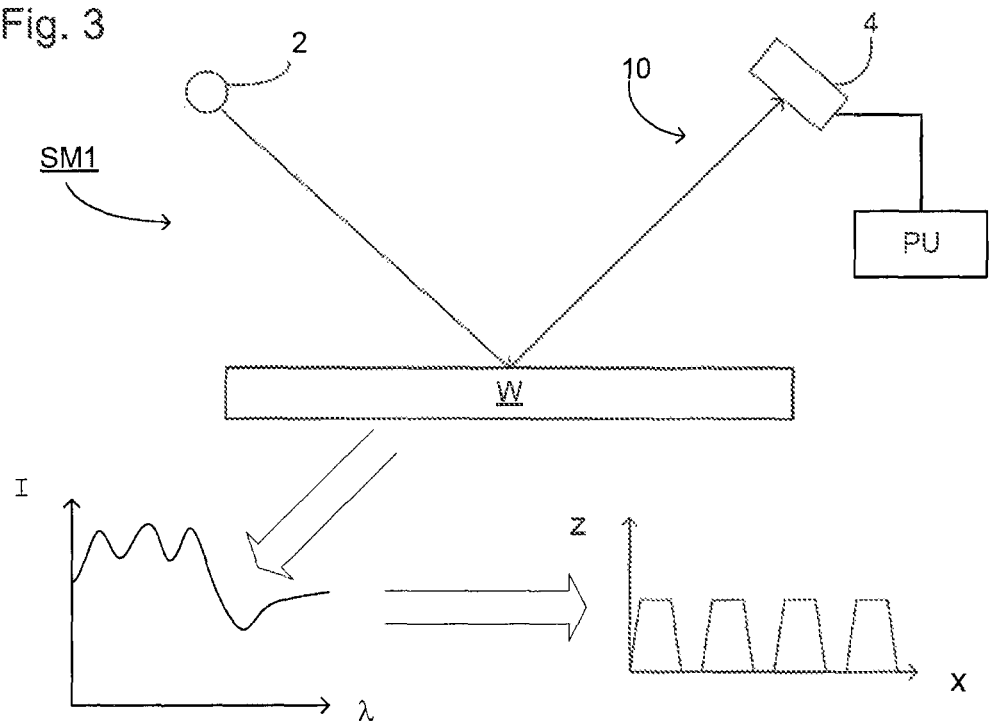
FIG. 3 depicts a first scatterometer.

FIG. 3 depicts a known scatterometer. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
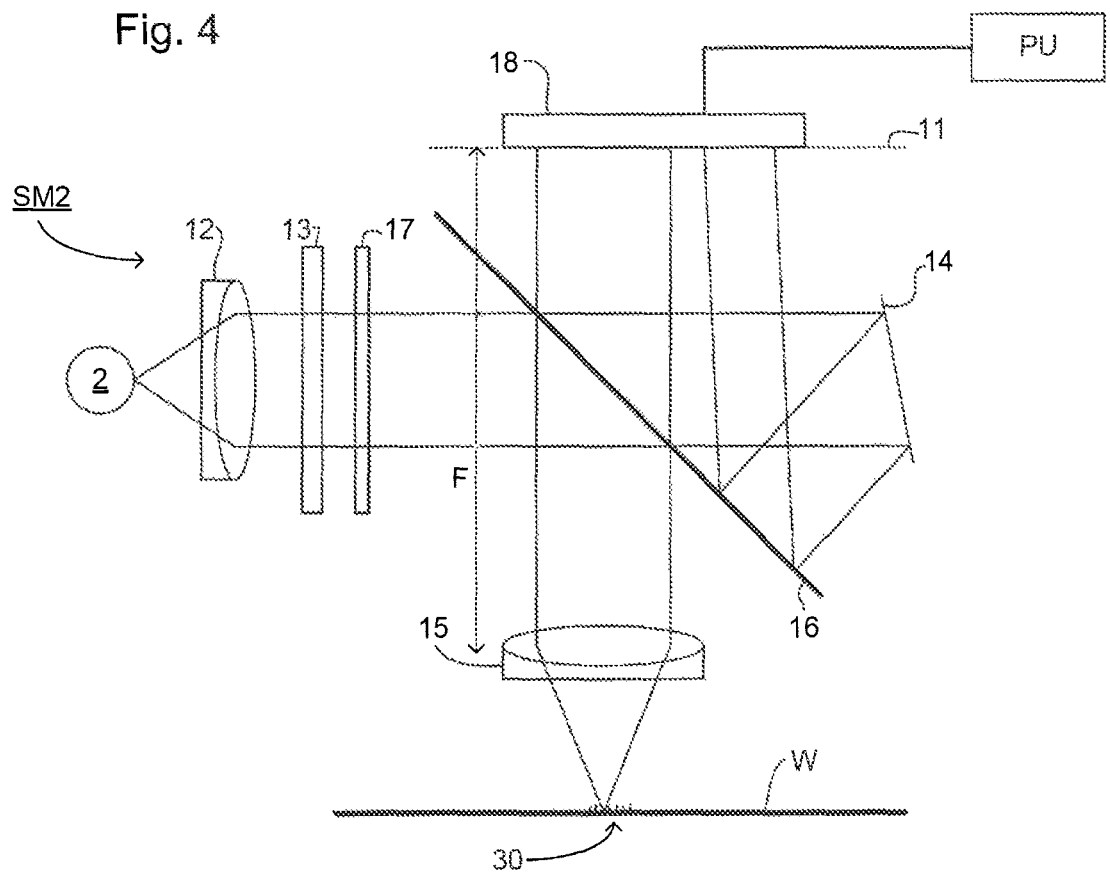
FIG. 4 depicts a second scatterometer.

Another scatterometer that may be used with an embodiment of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric polarized light.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the target can be performed in a number of ways. In a first type of process, represented by FIG. 5, a diffraction pattern based on a first estimate of the target structure (a first candidate structure) is calculated and compared with the observed diffraction pattern. Parameters of the model are then varied systematically and the diffraction recalculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
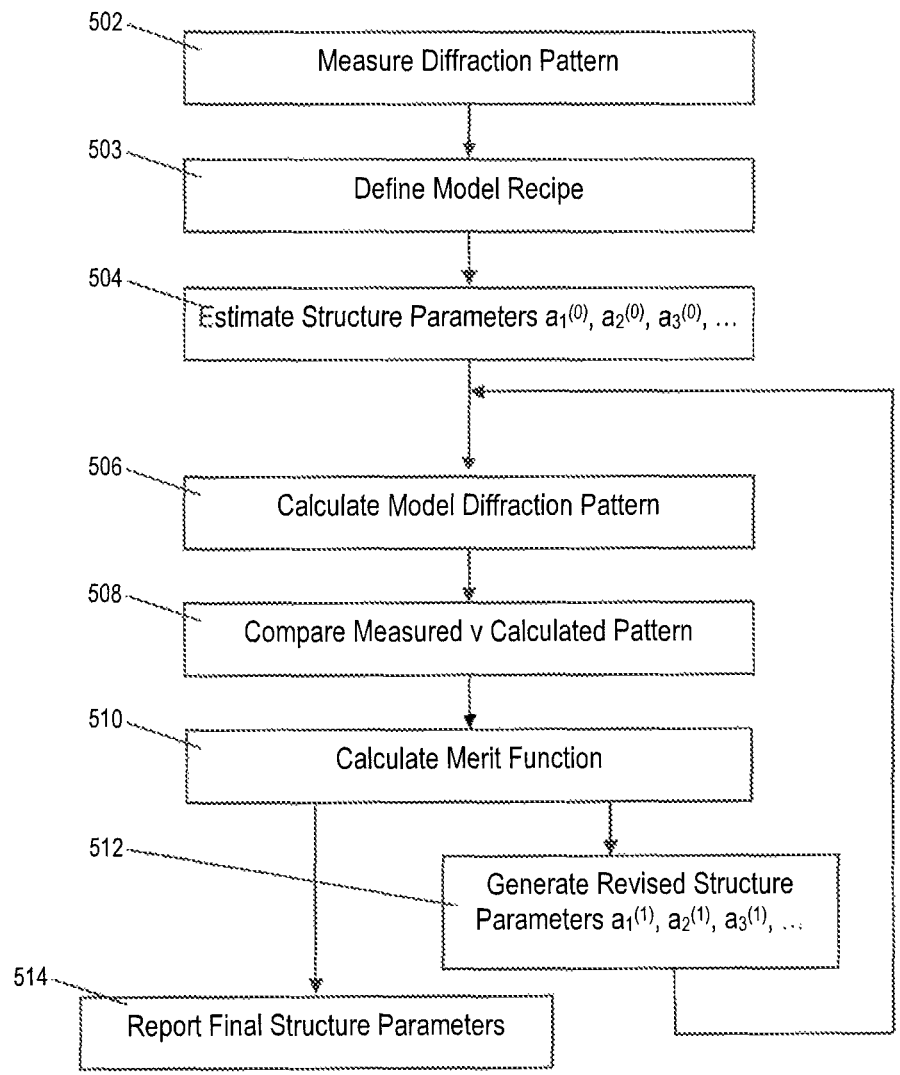
FIG. 5 depicts a first example process for reconstruction of a structure from scatterometer measurements.

Referring to FIG. 5 in more detail, the way the measurement of the target shape and/or material properties is carried out will be described in summary. The target will be assumed for this description to be periodic in only 1 direction (1-D structure). In practice it may be periodic in 2 directions (2-dimensional structure), and the processing will be adapted accordingly.

In step 502: The diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

In step 503: A 'model recipe' is established which defines a parameterized model of the target structure in terms of a number of parameters $a_i(a_1, a_2, a_3$ and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, we shall introduce ways in which parameters can be permitted to vary without being fully independent floating parameters. For the purposes of describing FIG. 5, only the variable parameters are considered as parameters $p_i$.

In step 504: A model target structure is estimated by setting initial values $a_i^{(0)}$ for the floating parameters (i.e., $a_1^{(0)}, a_2^{(0)}, a_3^{(0)}$ and so on). Each floating parameter will be generated within certain predetermined ranges, as defined in the recipe.

In step 506: The parameters representing the estimated target structure, including shape together with the optical properties of the different elements of the model, are used to calculate the scattering properties, for example using a rigorous optical diffraction method such as RCWA or any other solver of Maxwell equations. This gives an estimated or model diffraction pattern of the estimated target structure.

In steps 508 and 510: The measured diffraction pattern and the model diffraction pattern are then compared and their similarities and differences are used to calculate a "merit function" for the model target structure.

In step 512: Assuming that the merit function indicates that the model needs to be improved before it represents accurately the actual target structure, new parameters $a_1^{(1)}, a_2^{(1)}, a_3^{(1)}$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514: When the merit function indicates that this iterative process has converged on a solution with a desired accuracy, the currently estimated parameters are reported as the measurement of the actual target structure.

The computation time of this iterative process is largely determined by the forward diffraction model used, i.e., the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 502. For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
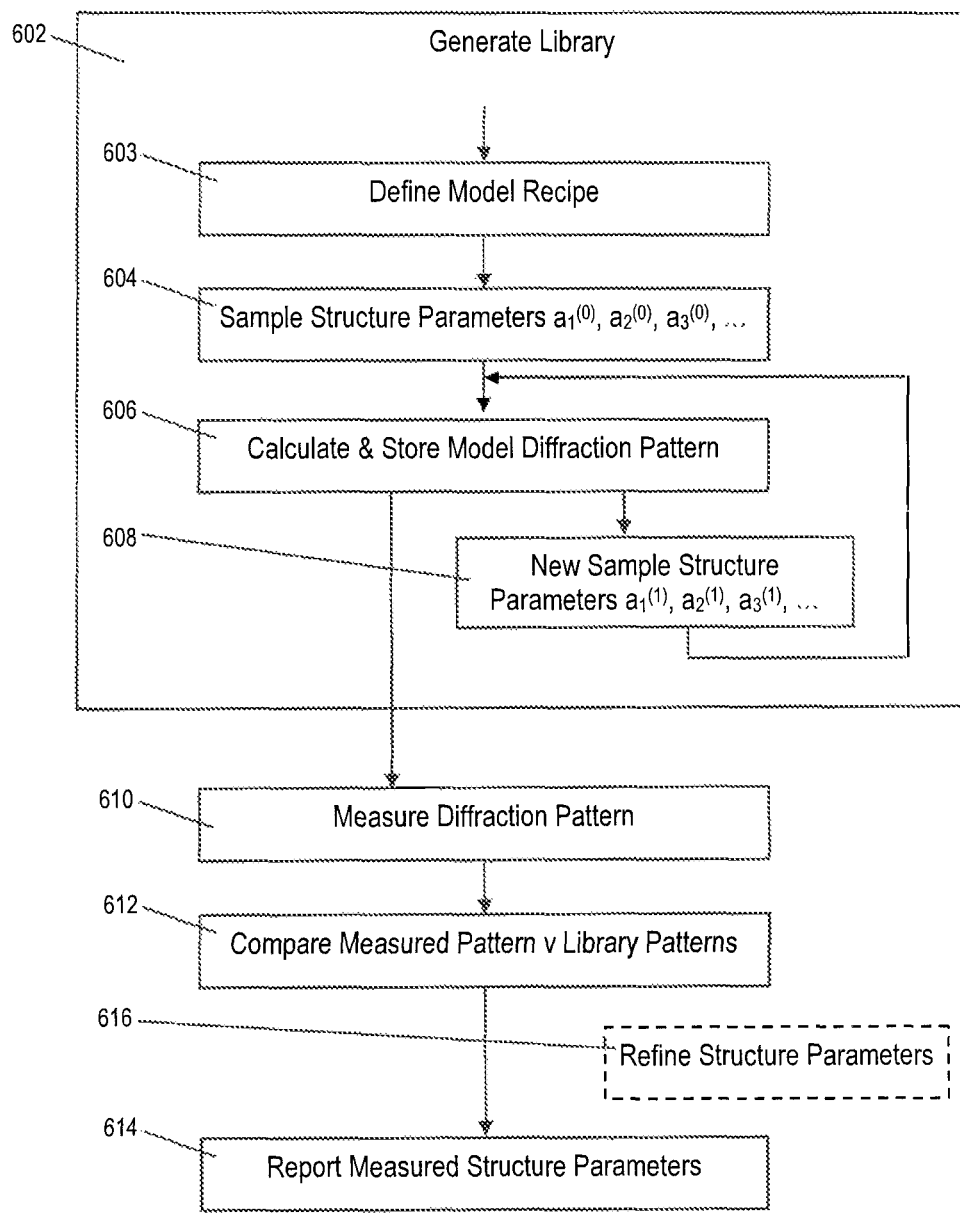
FIG. 6 depicts a second example process for reconstruction of a structure from scatterometer measurements.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602: The process of generating the library begins. A separate library may be generated for each type of target structure. The library may be generated by a user of the measurement apparatus according to need, or may be pre-generated by a supplier of the apparatus.

In step 603: A 'model recipe' is established which defines a parameterized model of the target structure in terms of a number of parameters $a_i(a_1, a_2, a_3$ and so on). Considerations are similar to those in step 503 of the iterative process.

In step 604: A first set of parameters $a_1^{(0)}, a_2^{(0)}, a_3^{(0)}$, etc. is generated, for example by generating random values of all the parameters, each within its expected range of values.

In step 606: A model diffraction pattern is calculated and stored in a library, representing the diffraction pattern expected from a target structure represented by the parameters.

In step 608: A new set of structure parameters $a_1^{(1)}, a_2^{(1)}, a_3^{(1)}$, etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610: After the library is generated (though it could be before), the real target 30 is placed in the scatterometer and its diffraction pattern is measured.

In step 612: The measured pattern is compared with the modeled patterns stored in the library to find the best matching pattern. The comparison may be made with every sample in the library, or a more systematic searching strategy may be employed, to reduce computational burden.

In step 614: If a match is found then the estimated target structure used to generate the matching library pattern can be determined to be the approximate object structure. The structure parameters corresponding to the matching sample are output as the measured structure parameters. The matching process may be performed directly on the model diffraction signals, or it may be performed on substitute models which are optimized for fast evaluation.

In step 616: Optionally, the nearest matching sample is used as a starting point, and a refinement process is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e., the calculation of the estimated model diffraction pattern using a rigorous optical diffraction theory from the estimated target structure.

Embodiments of the present invention improve the scatterometry technique in terms of robustness, to give measurements with a better accuracy. In order to do that, we use light emitted by a laser as source. In known scatterometers, the light source is a discharge lamp that, after wavelength filtering, can be thought as a quasi-monochromatic, but spatially incoherent, source. A difference with respect to the known scatterometry techniques resides in the coherence properties of the radiation produced by a laser. Here not only intensity but also phase information is available, and this can be profitably used to reduce the measurement uncertainty. In an embodiment, the approach is to focus the laser in a very small spot (with a radius of the size of the pitch) through an optical system and then to scan the whole sample. While only intensity is recorded, the phase information is any case present, and if the different scan positions overlap, then there is enough redundancy to retrieve the phase information from the only intensity measurement. The phase can be retrieved through phase retrieval algorithms, such as, for instance, described by Rodenburg et al [17]. Additionally the technique allows investigation of only part of the target, where necessary.

In an embodiment, a focused spot is incident on the target grating and the scattered light intensity is measured. Then the relative position of the grating with respect to the incident spot is shifted, keeping some overlap with the previous position, and intensity is recorded again. The set of measured intensities is used to retrieve the phase information. With the additional information available (that is phase, not just intensity) better estimations, with smaller uncertainties, of the target structure parameters can be made.

Figure 7:
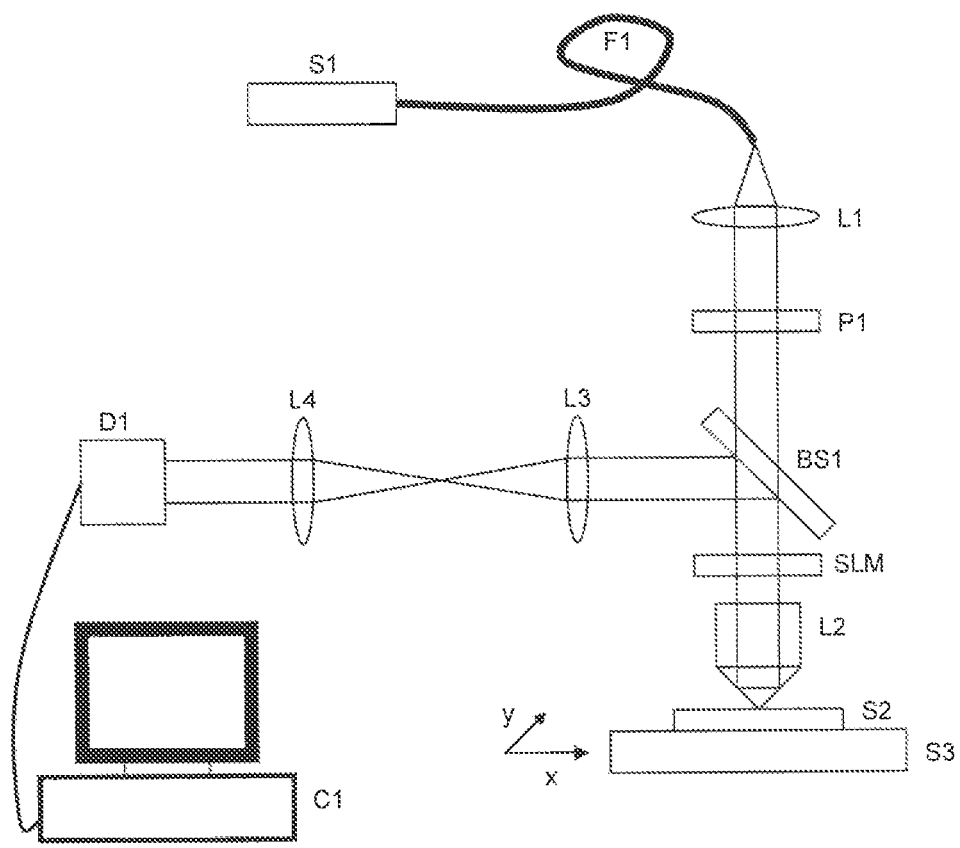
FIG. 7 illustrates an inspection apparatus according to an embodiment of the present invention.

FIG. 7 illustrates an inspection apparatus according to an embodiment of the present invention. With reference to FIG. 7, coherent light from a laser source S1 is coupled into a single mode fiber F1 and directed to a projection system (L1 through to L2). Lens L1 collimates the light from the fiber F1. The collimated beam is linearly polarized with polarizer P1. The light beam is then partly transmitted by the non-polarizing beam-splitter BS1, optionally through spatial light modulator SLM (the SLM is not needed if the target position is shifted with respect to the incident beam, as described below), and is focused with a high NA microscope objective lens L2 onto the sample S2. With translation stage S3 the sample S2 can be translated along the x- and y-directions thus acting as an actuator to shift the relative position between the target and the projection system. The scattered light from target sample S2 is captured with objective lens L2 and is partly reflected by non-polarizing beam-splitter BS1. With lenses L3 and L4 the back focal plane of the microscope objective L2 is imaged onto the camera D1. The image of measurement system camera D1 is processed with computer C1.

Figure 8:
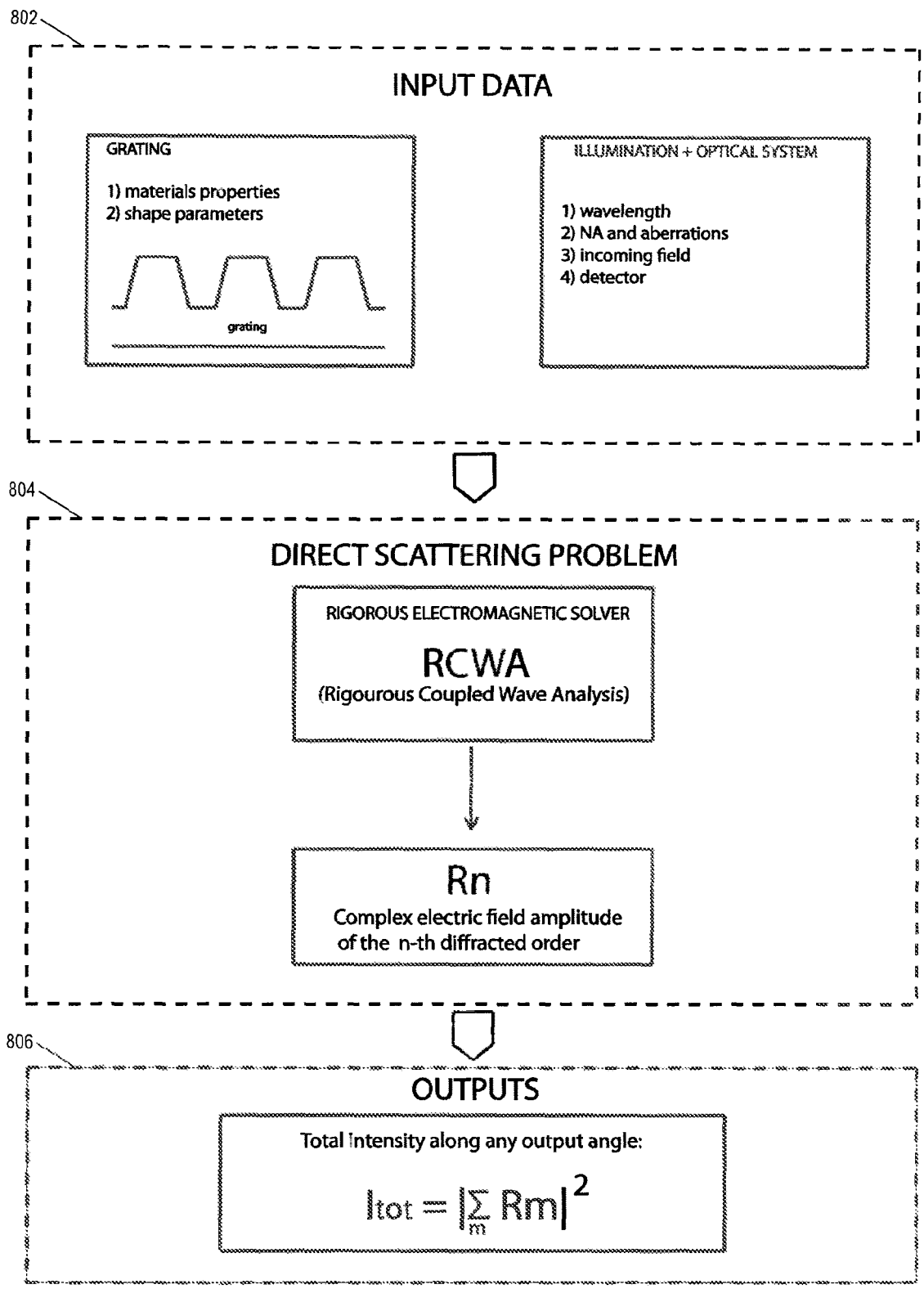
FIG. 8 illustrates the steps of a direct scattering problem for gratings using coherent illumination.

FIG. 8 illustrates the steps of a forward diffraction model (a direct scattering problem) for gratings using coherent illumination. A classical direct scattering problem is a problem where one knows an object and an incident field and wants to determine how such field is scattered by the object.

First of all the input data are defined 802. The shape of the grating (parameterized in terms of a finite number of parameters) is taken into account as well as all the indices of refraction of any material involved. Also, wavelength of the incident light, numerical aperture (NA) of the microscope objective, the spatial distribution of the field being focused by the microscope objective and the detector are taken into account. The next step 804 is then to use such information to generate the field scattered by the periodic grating in all directions in space. In order to do that, a rigorous electromagnetic solver that solves Maxwell equations, along with the continuity conditions, is used to calculate amplitude and phase of each component of the electric scattered field. A method, which is efficient for periodic structures, is Rigorous Coupled Wave Analysis (RCWA). After applying RCWA one gets the complex amplitudes (complex means real amplitude and real phase) of all diffracted orders.

In an embodiment of the present invention, the algorithm to compute the diffracted amplitudes $R_n$ works as follows:

Given a direction in space, single out all incident plane waves, which are part of the plane wave spectrum of the focused field, that have one of their diffracted orders propagating in that direction.

Repeat step 1 for all needed directions.

The last step 806 is to generate the output, namely the intensity distribution, for all directions. How this is done depends on the coherence properties of the incident field.

For coherent illumination, where there are M diffracting orders propagating in a given direction, the total intensity is given by $$I = \left| \sum_{m=1}^{M} R_m \right|^2$$

This is different from the case of incoherent illumination, where the total intensity is given by $$I = \sum_{m=1}^{M} |R_m|^2$$

Once a collection of diffraction patterns is available, the phase can be retrieved using the self-referenced, iterative method described in [15-17]. First one makes a guess for the target's amplitude and phase. For one position of the illumination, the far field is then computed by Fourier transforming the near field, as provided by RCWA. The diffraction pattern obtained in this way, probably incorrect, is then corrected by imposing the right amplitude provided by the measured intensity diffraction pattern, while the phase is not changed. Then an inverse Fourier transform is made to go back to the near field to obtain a better estimate of the object. The procedure, repeated for all the measured diffraction patterns in a iterative way, converges to a final estimate of the phase diffraction pattern, originally not available from intensity measurements alone.

Below, we describe how the performance of optical scatterometry can be improved when spatially coherent light is utilized for illumination. The analysis is based on a comparison between the estimated uncertainty in the measurement of structure parameters when spatially coherent or completely incoherent light is used as illumination.

In Section 2 a model for the diffraction grating and the illumination is chosen while in Section 3 we discuss the statistical model used to estimate the uncertainties on the structure parameters. In Section 4 the main results of the work are discussed and then a summary is presented in the Conclusions.

2. Models for Grating and Illumination.

Figure 9:
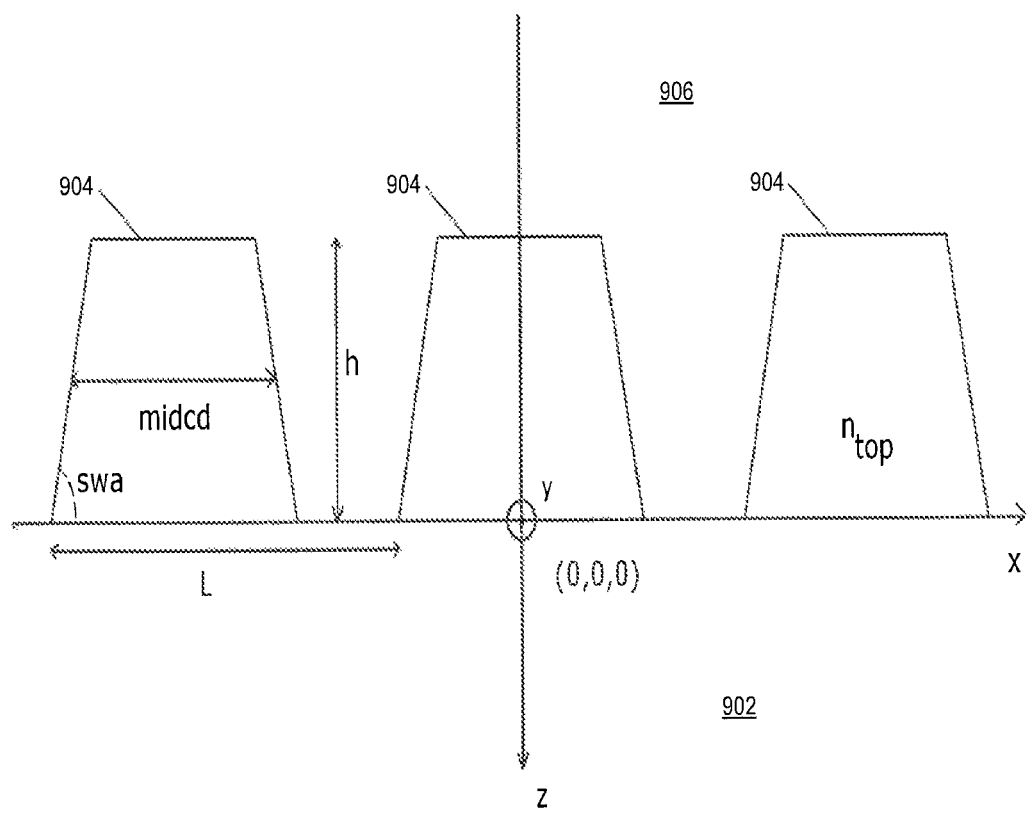
FIG. 9 illustrates a grating profile with the corresponding target structure parameters used to describe the geometrical profile.

Let us assume we have a perfectly periodic, one dimensional, symmetric, infinite diffraction grating with spatial period L. By one dimensional we mean that the grating properties are invariant along one direction (for example, the y-axis), while it is periodic along the other (x-axis). For simplicity, and without a real loss of generality, we will consider a simple structure as that shown in FIG. 9. The model grating consists of a bulk 902 or substrate of index of refraction $n_{bulk}$ with, on top of it, a different medium 904 of index of refraction. The surrounding medium 906 is assumed to be air with n=1. Usually the spatial period is known with good accuracy but not the actual shape within one period. This shape can be parameterized in terms of a given number of parameters representing the real unknowns that have to be determined by the measurements. In the present case we consider a trapezoidal shape fully described through three parameters: side-wall angle (swa), critical dimension at half height (midcd) and height (h) as shown in FIG. 9.

After modelling the grating, one has to specify the properties of the illumination. The light coming from the source passes through a high-NA objective and is subsequently focused onto the grating. After interacting with the grating, part of the scattered light is collected again by the same objective and directed to the detector. The advantage of using an objective lens resides in the fact that it is possible to illuminate the grating with different incident plane waves at the same time (all those plane waves that lie within the NA). We will assume that in the back focal plane of the objective there is a uniform field distribution and that the role of the lens is only to convert the light coming from each point of that plane in a plane wave impinging on the grating itself.

The comparison between using coherent and incoherent light will be based on a maximum likelihood estimate, as explained in the next section.

3. Estimated Uncertainties.

It will be assumed that the polarization of the incident light, before the objective, can be controlled and, with reference to FIG. 9, can be along x or y direction. For any of those two orthogonal incident polarizations the full scattered light is measured without polarization selection. This leads to two far field intensity measurements, $I_x$ and $I_y$, say, corresponding to x and y incident polarized light in the pupil, respectively. We can group $I_x$ and $I_y$ in a unique measurement output consisting of a collection of intensity data points $\{I_i^{(m)}\}$, $i=_1, \ldots N$, with $N=2N_{det}$ denoting the total number of points and $N_{det}$ being the number of pixels on the detector. The index m recalls that it deals with measured data.

Predictions over the possible outcomes of an experiment are possible only when a rigorous computation method is chosen. In our case we use Rigorous Coupled Wave Analysis (RCWA) [9, 10, 11], which is known to be computational efficient for periodic structures. If $p_i$ denotes the known physical conditions, like incident angles, wavelength, polarization, and so on, of the i-th data point and a the space of shape parameters, the result of a simulation can be written as $\{I(p_i, a)\}$. Since the actual values of the shape parameters a are unknown, one cannot expect, in general, $\{I_i^{(m)}\}$ and $\{I(p_i, a)\}$ to coincide. Additionally, every experiment is affected by noise which means that along with the data $\{I_i^{(m)}\}$ we have also the corresponding uncertainties $\{\sigma_i\}$, i=1, ... N. On following the approach suggested in [12], we assume that the noise of the measured data is normally distributed with standard deviations given just by the measured uncertainties $\{\sigma_i\}$ [13]. Also, for simplicity it will be assumed, from now on, that $\sigma_i = \sigma$, $\forall i$. It is reasonable to say that when the set of shape parameters coincides, within some accuracy, with the real one, then the distance between measurements and simulations should be minimum. In statistical theory, a good way to define such a distance is using the $\chi^2$ distribution $$\chi^2 = \frac{1}{N}\sum_{i=1}^{N}\left[\frac{I_i^{(m)} - I(p_i, a)}{\sigma_i}\right]^2 \quad (1)$$

and to look for that set of parameters $a_{min}$ that minimizes it [14]. Of course, in case of an ideal noiseless system (i.e., $\sigma_i=0$, $\forall i$), and the assumption that the mathematical model is complete, the minimum of $\chi^2$ would be zero and would lead exactly to the right set of parameters without any uncertainty. However, some noise will always be present and this raises the issue of how good, or accurate, a parameter estimation is.

What is interesting in this approach is that all estimated uncertainties, $\Delta a$ say, on the shape parameters can be derived by expanding Eq. 1 in Taylor's series around the minimum. The second order derivative of such expansion is $$\frac{\partial^2 \chi^2}{\partial a_j \partial a_k} = \frac{2}{N}\sum_{i=1}^{N}\frac{1}{\sigma_i^2}\left[\frac{\partial I(p_i, a)}{\partial a_j}\frac{\partial I(p_i, a)}{\partial a_k} - [I_i^{(m)} - I(p_i, a)]\frac{\partial^2 I(p_i a)}{\partial a_k \partial a_j}\right] \quad (2)$$

Usually the term containing the second order derivative in Eq. 2 is neglected, since summing on a large number of points N tends to average the difference $[I_i^{(m)}-I(p_i,a)]$ out. This assumption leads to a matrix $\{\alpha_{jk}\}$ $$[\alpha_{jk}] = \frac{1}{2}\frac{\partial^2 \chi^2}{\partial a_k \partial a_l} = \frac{1}{N}\sum_{i=1}^{N}\frac{1}{\sigma_i^2}\left[\frac{\partial I(p_i, a)}{\partial a_j}\frac{\partial I(p_i, a)}{\partial a_k}\right]_{a=a_{min}}, \quad (3)$$

with $j, k = 1, 2, 3 \ldots$ that is related to the estimated 3-sigma uncertainties for the shape parameters a as in the following $$\Delta a_j = 3\sqrt{C_{jj}}, \quad (4)$$

where $[C_{jk}]=[\alpha_{jk}]^{-1}$. An analysis of these uncertainties is fundamental to check how good the whole system is. In fact, large uncertainties mean that the technique does not resolve large variations of the shape parameters, which in turn denotes very low sensitivity with respect to grating's profile. Stated differently, large uncertainties imply that several realizations of the set a are equally compatible with the measurements and the technique cannot discern among them. On the other hand, small uncertainties are an indication that good accuracy, in determining the shape parameters, can be reached. It follows that a comparison between the corresponding estimated uncertainties on the shape parameters is a way to determine whether the technique is better than other.

In the next section we are going to make such a comparison, when coherent or incoherent light is used as illumination, by discussing few examples.

4. A Comparison Between Spatially Coherent and Spatially Incoherent Light

Once the model for the grating and for the estimated uncertainties on its shape parameters is available, one is ready to analyze the effect of coherence. However one aspect should be clarified. When monochromatic, spatially incoherent light is used as source, it cannot be focused in a small area. This implies that a large spot illuminates a large portion of the grating at once. When a laser of the same wavelength is used, then the spot size can be of the order of the wavelength, becoming then comparable to the pitch size. It follows that, in the latter case, in order to cover the grating, a scanning scheme has to be implemented. Different scanning strategies can be realized. In an embodiment, we will suppose that during scanning of the object there is always a good overlap between two adjacent positions. This was recently profitably used in the context of phase retrieval problems where it resulted to be fundamental to reconstruct the original object's amplitude and phase [15, 16, 17]. In order to make a fair comparison, one should also take into account that since scanning adds more additional data points, and recalling that the final uncertainties scale with the total number N of data points as $1/\sqrt{N}$, more points implies smaller uncertainties. To be more precise, if only one position is considered in case of incoherent illumination and M positions for the coherent one, then in the latter case each uncertainty has to be increased by multiplying by a $\sqrt{M}$ factor. This is the reason that we have defined the $\chi^2$ distribution in Eq. 1 in a slightly different way, with respect the standard form found in literature, by dividing by the number of points N. In this way we have removed any difference in the uncertainties only originating from having a different number of data points.

The need for scanning has further consequences. From a practical viewpoint it makes obviously the measurement process slower, since more acquisition steps are required. On the other hand, it also affects the uncertainties estimation analysis, as presented here. In fact, at every new position it is necessary to solve rigorously the scattering problem between incident field and grating, which is time consuming. Fortunately, in case of an ideal infinite periodic grating the complex amplitude $R_n$ of the n-th diffraction order in any shifted position can be derived easily from the same original position just by adjusting the phase.

It is not necessary to re-run an additional simulation, after shifting the illumination of an amount $\Delta x$, to compute the complex amplitude of all diffraction orders, once the result in the original configuration (i.e., without any shift) is available. In this section we derive the expression of the phase shift that is needed to do that.

Let us assume that an incident field $E^{inc}(x,y,z)$ impinges on an infinite grating, that is invariant along the y direction.

$E^{inc}(x,y,z)$ can be any general field, but we will focused only on one of the plane waves, $u \exp[i(k_x x + k_y y + k_z z)]$, representing its angular spectrum. As usual $k_x$, $k_y$, $k_z$ are the components of the wave vector of the incident wave and $u$ is the unit vector describing the polarization state. The total field above the grating can be written then in terms of the Rayleigh expansion as [18, 19]

$$E_1(x, y, z) = \sum_n R_n \exp[i(k_{xn}x + k_y y - k_{zn}z)] + u\exp[i(k_x x + k_y y + k_z z)] \quad (5)$$

where $k_{xn}$, $k_{yn}$ and $k_{zn}$ are the components of the wavevector of the n-th plane wave, with $k_{xn}^2 + k_{yn}^2 + k_{zn}^2 = k^2$, with $k = 2\pi/\lambda$. From Bragg's law we know that $k_{xn}$, $k_{yn}$ and $k_{zn}$ are related to $k_x$, $k_y$ and $k$, through the relations $$k_{xn} = k_x + \frac{2\pi n}{L} \quad (6)$$
$$k_{yn} = k_y$$
$$k_{zn} = \sqrt{k^2 - k_{xn}^2 - k_{yn}^2}$$

with L the period of the grating. The complex amplitudes $R_n$ are the unknowns that have to be determined by solving Maxwell's equations.

If we now shift the whole Eq. 5 by $\Delta x$ along the x direction we have $$E_1(x - \Delta x, y, z) = \sum_n \tilde{R}_n \exp[i(k_{xn}(x - \Delta x) + k_y y - k_{1,zn}z)] + \quad (7)$$
$$\exp[ik_x(x - \Delta x) + k_y y + k_z z]u =$$
$$\sum_n \tilde{R}_n \exp(-ik_{xn}\Delta x)\exp[i(k_{xn}x + k_y y - k_{1,zn}z)] +$$
$$\exp[ik_x x + k_y y + k_z z]\exp(-ik_x \Delta x)u$$

where $\tilde{R}_n$ are the new coefficients that have to be computed in the new configuration. Now from Eq. 7 we see that the incident plane wave propagates exactly along the same direction, which means that the incident wave vector is unchanged. Hence the interaction with the infinite grating, which is a linear process, is the same as before. The only difference consists in having a different complex amplitude, so that the final effect of shifting should be the presence of a constant term $\exp[-ik_x(\Delta x)]$ in front of the scattered field. In other words, the final result must be $$E_1(x - \Delta x, y, z) = \sum_n \exp(-ik_x \Delta x) R_n \exp[i(k_{xn}x + k_y y - k_{1,zn}z)] + \quad (8)$$
$$\exp[ik_x x + k_y y + k_z z]\exp(-ik_x \Delta x)u$$

It is possible to get Eq. 8 from Eq. 7 under the condition $$\exp(-ik_x \Delta x)R_n = \tilde{R}_n \exp(-ik_x \Delta x) \quad (9)$$

which in tarn implies, from Eq. 6, $$\tilde{R}_n = R_n \exp(i2\pi n/L \Delta x) \quad (10)$$

This represents the phase correction we were looking for to account for the lateral shift $\Delta x$.

FIG. 9 illustrates grating profile with the corresponding shape parameters (midcd, swa, h) used to describe the geometrical profile. The grating, as shown in FIG. 9, has parameters L=189 nm, midcd=27 nm, swa=87°, h=40 nm and NA=0.95 We choose silicon as bulk material and polymethyl methacrylate (PMMA) resist as grating material. We study the uncertainties on a range of possible wavelengths in the interval $\lambda \in (145$ nm, 450 nm). In order to build the matrix $[\alpha]$ in Eq. 3 one has to implement the derivatives numerically. In the present case, a central difference formula is used with an increment of 0.1 nm in case of midcd and height variation and 0.1° in case of swa variation.

Figure 10A:
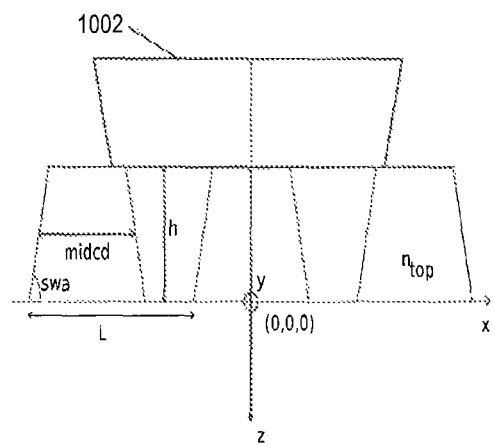
FIG. 10a illustrates an initial configuration and FIG. 10b illustrates one shifted configuration for coherent illumination.
Figure 10B:
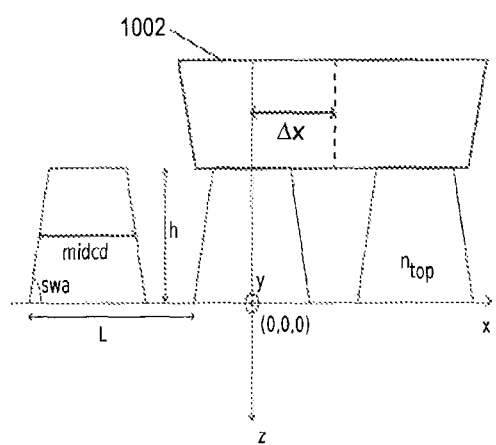

In the case of coherent illumination, three different positions were considered. An illustrative diagram is given in FIGS. 10a-b (where only two positions are shown). FIG. 10a illustrates an initial configuration and FIG. 10b illustrates one shifted configuration in the case of coherent illumination. In FIG. 10a the incident spot 1002 is initially illuminating a first region centered on one PMMA line. The other two second illumination regions are at positions (one of which is shown in FIG. 10b) that correspond to the same lateral shift $\Delta x$, but in two opposite directions. Since the absolute value of the uncertainties depends on the noise level considered (i.e., on the $\{\sigma_i\}$ introduced in the previous section) as well as on the number of points N in the detector, it is advantageous to discuss the results independently of these values that can change from case to case. For this reason, in FIG. 11a-c the ratios between the uncertainties $\Delta a^{inc}$ and $\Delta a^{coh}$ (Eq. 4) for incoherent light and those for coherent case are shown for the three parameters of interest.

All plots are shown as functions of the dimensionless variable $\lambda/(NA\,L)$. This is convenient since it allows us to check easily how many diffraction orders enter into the exit pupil. In fact, when $\lambda/(NA\,L) \geq 2$, only the scattered zero orders of all incident plane waves fall into the NA of the microscope objective. Since coherence can manifest itself only in terms of interference effects between overlapping orders, in that case coherent and incoherent light behave in the same way and eventual coherent effects cannot be seen. When $1 \leq 1/(NA\,L) < 2$ also the first orders are included in the lens pupil. In general, when $\lambda/(NA\,L) < 2/s$, with s positive integer, then the first s-th order are collected by the lens.

To analyze also the dependence on the lateral shift, we have studied different situations.

FIGS. 11a to 11c show the calculated ratio between the uncertainties $\Delta a^{inc}$ and $\Delta a^{coh}$, in case of incoherent and coherent light respectively. L=189 nm is the grating's period and $\lambda$ the wavelength. NA=0.95 is the numerical aperture. The curves were obtained by varying $\lambda$ in the range of (145 nm, 450 nm). a) midcd, b) swa, c) h. It should be noted that the dispersion relation for the optical constants n and k is accounted for.

All continuous lines in FIGS. 11a to 11c correspond to a lateral shift $\Delta x = L/2$. The dotted ones were computed with a shift of L/4 while the dashed ones again with a lateral shift of L/2 but including also an initial bias of midcd 12. The reason for introducing such bias is twofold and will be described below.

If we look at the FIG. 11a, continuous line, we see that for large values of $\lambda/(NA\,L)$ (larger than 2) the ratio between the two uncertainties is unity. This means that there is no difference between the two configurations, as it should be. However, as soon as $\lambda/(NA\,L)$ tends to be smaller than 2 then some difference shows up. The first orders start to be collected by the lens and, as a consequence of that, the uncertainty ratio departs from unity. It gets bigger than one in the whole range of studied wavelengths reaching its maximum for $\lambda/(NA\,L)=1.17$, where the uncertainty obtained using coherent light is more that 2.5 smaller than that obtainable using incoherent light. It is also important to notice that the ratio is not a monotone function of the independent variable λ/(NA L). Even more important is to observe that when the lateral shift is smaller, as in the dotted line (shift L/4), the difference between the two cases gets even bigger. In that case the maximum gain is about 3.4. To understand this phenomenon, one should recall that the focused field does not have a uniform amplitude but shows an Airy pattern-like structure. Intuitively we can say that the field is more sensitive to shape changes when the central lobe is in the vicinity of one line and/or its edges. This is not the case for a shifted beam when the beam's spot size is small enough and the period L and the lateral shift Δx are both much larger than the midcd. To confirm this, we computed the uncertainties ratio for the case when the lateral shift is again L/2 but the incident beam is initially centered on one line's edge (FIG. 11c, dashed curve). As expected, the ratio is now higher. This illustrates that using optical coherent scatterometry contains also information on the relative spatial position between illumination and grating.

The same analysis can be repeated for the other two parameters, swa and height. In FIG. 11b the uncertainties ratios for swa are presented with essentially the same features discussed before. Finally, FIG. 11c shows the uncertainties ratio for the height. Here an additional comment is necessary. It is manifest that the difference among the three scanning schemes is now notably reduced. But this is not surprising, since the detection of height variations is expected to be less sensitive to the relative position grating-illumination than changes in the midcd and swa.

FIG. 12 illustrates a method of determining a structure parameter of a target on a substrate. This embodiment has the steps:

In step 1202: Illuminating a first region of the target with a first beam of coherent radiation using a projection system and measuring a diffraction intensity pattern arising from the illumination of the first region.

In step 1204: Shifting the relative position between the target and the projection system to offset a second region to be illuminated from the first region. Alternatively, the second region is offset from the first region by imposing a phase shift on the first beam to form the second beam, for example using the spatial light modulator SLM of FIG. 7.

In step 1206: Illuminating the second region of the target, offset from and overlapping with the first region, with a second beam of coherent radiation using the projection system and measuring a second diffraction intensity pattern arising from the illumination of the second region. The first beam and the second beam may be the same beam. The first and second beams are focused to a size on the target the same order as a pitch of the target, the size selected such that the respective diffraction intensity patterns produced with the coherent radiation are different from corresponding diffraction patterns that would be produced with incoherent radiation in the same conditions. The diffraction intensity patterns are measured in the pupil plane, or in a plane conjugate to the pupil plane, of an objective of the projection system. A microscope objective has only one pupil plane. This is the back focal plane of the objective. One could either measure the intensity pattern at the pupil plane, or at a plane conjugate to the pupil plane, which is an image of the pupil plane. Steps 1202 to 1206 are repeated until the whole portion of interest of the target has been illuminated once, with adjacent illumination spots having some physical overlap.

In step 1208: Retrieving phase information from the measured first and second diffraction intensity patterns.

In step 1210: Modeling the target using an estimated structure parameter to calculate a modeled diffraction intensity pattern and modeled phase information. Modeling the target may comprise calculating the modeled diffraction intensity pattern by squaring the sum of calculated complex electric fields. Modeling the target may use a phase correction to account for the offset.

In step 1212: Determining the structure parameter of the target corresponding to the estimated structure parameter by comparing at least one of the first and second measured diffraction intensity patterns and the retrieved phase to the calculated modeled diffraction intensity pattern and the modeled phase information.

In step 1214: Reporting the determined structure parameters.

The impact of using spatially coherent light in optical scatterometry has been described. After considering a specific model for the grating and for the illumination path, we computed the expected uncertainties in the shape parameters under the assumption of Gaussian distribution for the measurement noise and for the wavelength in the range (145 nm, 450 nm). The analysis shows that coherence can increase the precision in the grating's profile reconstruction. Compared with the incoherent case, it was shown that in some circumstances the estimated uncertainties on the shape parameters can be up to more than three times smaller than those obtained using standard discharge lamps.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    illuminating a first region of a target with a first beam of coherent radiation using a projection system;
    measuring a diffraction intensity pattern arising from the illumination of the first region;
    illuminating a second region of the target, offset from and overlapping with the first region, with a second beam of coherent radiation using the projection system;
    measuring a second diffraction intensity pattern arising from the illumination of the second region;
    retrieving phase information from the measured first and second diffraction intensity patterns;
    modeling the target using an estimated structure parameter to calculate a modeled diffraction intensity pattern;
    modeling the target using the estimated structure parameter to calculate modeled phase information; and
    determining the structure parameter of the target corresponding to the estimated structure parameter by comparing at least one of the first and second measured diffraction intensity patterns and the retrieved phase to the calculated modeled diffraction intensity pattern and the modeled phase information.

2. The method of claim 1, wherein the first beam and the second beam are the same beam.

3. The method of claim 1, wherein the second region is offset from the first region by shifting the relative position between the target and the projection system.

4. The method of claim 1, wherein the second region is offset from the first region by imposing a phase shift on the first beam to form the second beam.

5. The method of claim 4, wherein the phase shift is imposed by a spatial light modulator.

6. The method of claim 1, wherein the modeling the target comprises calculating the modeled diffraction intensity pattern by squaring the sum of calculated complex electric fields.

7. The method of claim 1, wherein the first and second beams are focused to a size on the target the same order as a pitch of the target, the size selected such that the respective diffraction intensity patterns produced with the coherent radiation are different from corresponding diffraction patterns that would be produced with incoherent radiation in the same conditions.

8. The method of claim 1, wherein the diffraction intensity patterns are measured in the pupil plane, or in a plane conjugate to the pupil plane, of an objective of the projection system.

9. The method of claim 1, wherein the modeling the target comprises using a phase correction to account for the offset.

10. An inspection apparatus comprising:
    a projection system configured to illuminate a first region of a target with a first beam of coherent radiation;
    a measurement system configured to measure a diffraction intensity pattern arising from the illumination of the first region;
    wherein the projection system is configured to illuminate a second region of the target, offset from and overlapping with the first region, with a second beam of coherent radiation and the measurement system is configured to measure a second diffraction intensity pattern arising from the illumination of the second region; and
    a processor configured to:
        retrieve phase information from the measured first and second diffraction intensity patterns;
        model the target using an estimated structure parameter to calculate a modeled diffraction intensity pattern;
        model the target using the estimated structure parameter to calculate modeled phase information; and
        determine the structure parameter of the target corresponding to the estimated structure parameter by comparing at least one of the first and second measured diffraction intensity patterns and the retrieved phase to the calculated modeled diffraction intensity pattern and the modeled phase information.

11. The inspection apparatus of claim 10, wherein the first beam and the second beam are the same beam.

12. The inspection apparatus of claim 10, further comprising an actuator configured to shift the relative position between the target and the projection system to offset the second region from the first region.

13. The inspection apparatus of claim 10, further comprising a phase shifter configured to impose a phase shift on the first beam to form the second beam to offset the second region from the first region.

14. The inspection apparatus of claim 13, further comprising a spatial light modulator to impose the phase shift.

15. The inspection apparatus of claim 10, wherein the processor is configured to model the target by calculating the modeled diffraction intensity pattern by squaring the sum of calculated complex electric fields.

16. The inspection apparatus claim 10, wherein the first and second beams are focused to a size on the target the same order as a pitch of the target, the size selected such that the respective diffraction intensity patterns produced with the coherent radiation are different from corresponding diffraction patterns that would be produced with incoherent radiation in the same conditions.

17. The inspection apparatus of claim 10, wherein the measurement system is configured to measure the diffraction intensity patterns in the pupil plane, or in a plane conjugate to the pupil plane, of an objective of the projection system.

18. The inspection apparatus of claim 10, wherein the processor is configured to model the target using a phase correction to account for the offset.

19. A non-transitory computer readable medium containing one or more sequences of machine-readable instructions, the instructions being adapted to cause one or more processors to perform an operation comprising:

illuminating a first region of a target with a first beam of coherent radiation using a projection system;

measuring a diffraction intensity pattern arising from the illumination of the first region;

illuminating a second region of the target, offset from and overlapping with the first region, with a second beam of coherent radiation using the projection system;

measuring a second diffraction intensity pattern arising from the illumination of the second region;

retrieving phase information from the measured first and second diffraction intensity patterns;

modeling the target using an estimated structure parameter to calculate a modeled diffraction intensity pattern;

modeling the target using the estimated structure parameter to calculate modeled phase information; and determining the structure parameter of the target corresponding to the estimated structure parameter by comparing at least one of the first and second measured diffraction intensity patterns and the retrieved phase to the calculated modeled diffraction intensity pattern and the modeled phase information.

* * * * *